US008539421B2

(12) United States Patent
Agarwal et al.

(10) Patent No.: US 8,539,421 B2
(45) Date of Patent: Sep. 17, 2013

(54) LAYOUT-SPECIFIC CLASSIFICATION AND PRIORITIZATION OF RECOMMENDED RULES VIOLATIONS

(75) Inventors: Kanak Behari Agarwal, Austin, TX (US); Sani Richard Nassif, Austin, TX (US)

(73) Assignee: International Business Machines Corporaton, Armonk, NY (US)

( * ) Notice: Subject to any disclaimer, the term of this patent is extended or adjusted under 35 U.S.C. 154(b) by 0 days.

(21) Appl. No.: 13/328,942

(22) Filed: Dec. 16, 2011

(65) Prior Publication Data
US 2013/0159948 A1   Jun. 20, 2013

(51) Int. Cl.
G06F 17/50 (2006.01)
(52) U.S. Cl.
USPC .............. 716/132; 716/52; 716/112; 716/136
(58) Field of Classification Search
None
See application file for complete search history.

(56) References Cited

U.S. PATENT DOCUMENTS

| | | | |
|---|---|---|---|
| 6,507,930 B1* | 1/2003 | Bass et al. ................ | 716/54 |
| 6,892,368 B2 | 5/2005 | Li et al. | |
| 7,076,749 B2* | 7/2006 | Kemerer et al. ............. | 716/52 |
| 7,302,654 B2 | 11/2007 | Lakshmanan et al. | |
| 7,454,721 B2* | 11/2008 | Hibbeler et al. ............ | 716/132 |
| 7,487,479 B1* | 2/2009 | Malik et al. ................ | 716/100 |
| 7,895,562 B2* | 2/2011 | Gray et al. ................. | 716/132 |
| 7,987,442 B2* | 7/2011 | Rajski et al. ............... | 716/136 |
| 2007/0101303 A1* | 5/2007 | Lien et al. .................. | 716/5 |
| 2009/0007053 A1 | 1/2009 | Kim | |
| 2009/0158223 A1* | 6/2009 | Gray et al. ................. | 716/2 |
| 2009/0187877 A1 | 7/2009 | Vickery, III | |
| 2010/0119144 A1 | 5/2010 | Kulkarni et al. | |
| 2010/0192113 A1 | 7/2010 | Brelsford et al. | |
| 2011/0023001 A1 | 1/2011 | Giffel | |
| 2011/0185329 A1 | 7/2011 | Wen et al. | |
| 2011/0204470 A1 | 8/2011 | Cheng et al. | |
| 2011/0231828 A1 | 9/2011 | Kaulgud et al. | |

OTHER PUBLICATIONS

Braasch et al. ; "Model-Based Verification and Analysis for 65/45nm Physical Design", 1-14, CDNLive! Sep. 2007.
Dhumaneet et al. ; "Lithography Constrained Placement and Post-Placement Layout Optimization for Manufacturability", 2011 IEEE Computer Society Annual Symposium on VLSI, 200-205.
Johansson et al. ; "Tracking Degradation in Software Product Lines Through Measurement of Design Rule Violations", 249-254, SEKE, 2002.
IBM et al. ; "Method for Display Ground Rule Violations in an Editor Based on the Viewable Mask Layers in Design", Apr. 26, 2011, 3 pages.

* cited by examiner

*Primary Examiner* — Leigh Garbowski
(74) *Attorney, Agent, or Firm* — Garg Law Firm, PLLC; Rakesh Garg; John Flynn

(57) ABSTRACT

A method, system, and computer program product for classifying and prioritizing a set of recommended rule (RR) violations in an integrated circuit (IC) design are provided in the illustrative embodiments. The set of RR violations is received. A layout corresponding to the IC design is received. A set of features is selected in the layout. A classification model corresponding to the set of features is selected. Using the set of features and the classification model, the first RR violation is classified into a classification from a set of classifications. The classification is prioritized in an order of priority such that the first RR violation in the classification is recommended for remedying in the order of priority.

20 Claims, 5 Drawing Sheets

*FIG. 1*
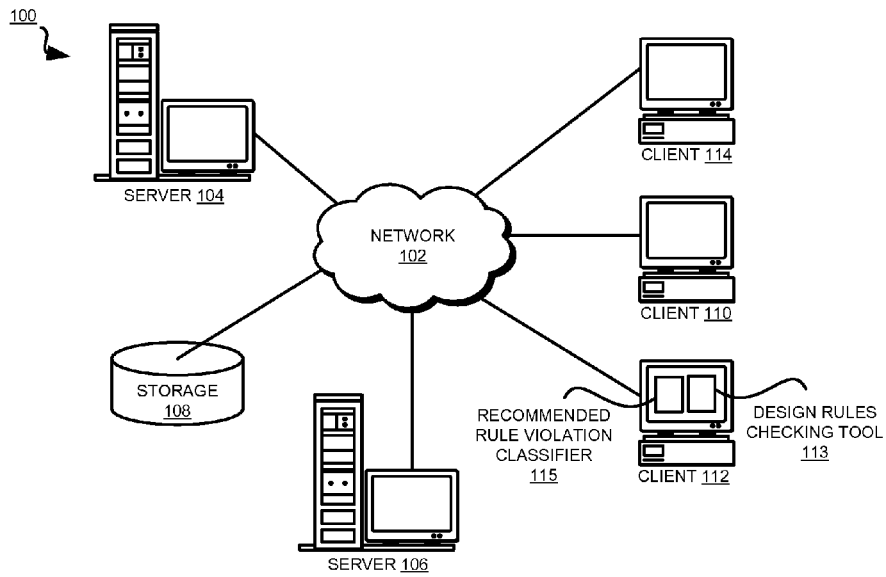
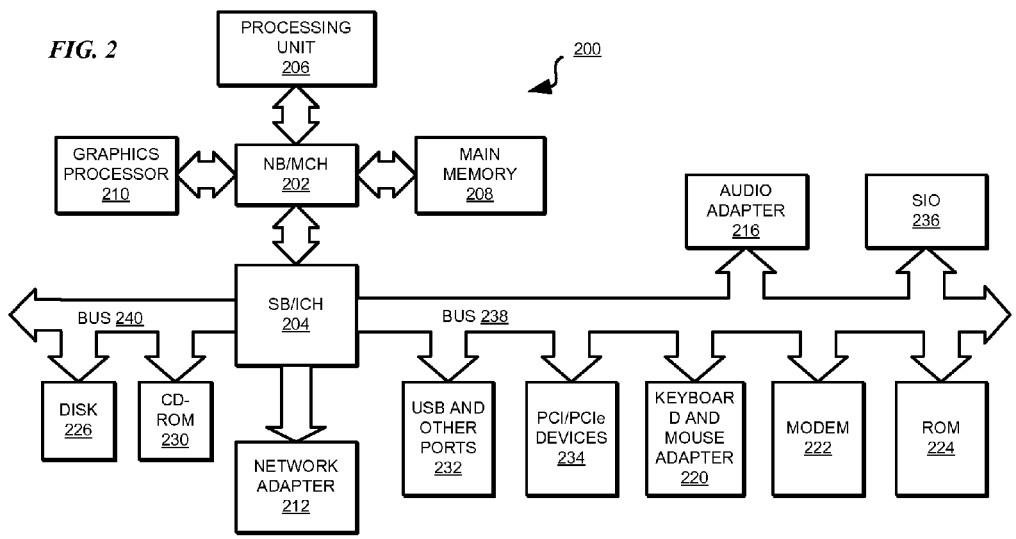
*FIG. 2*

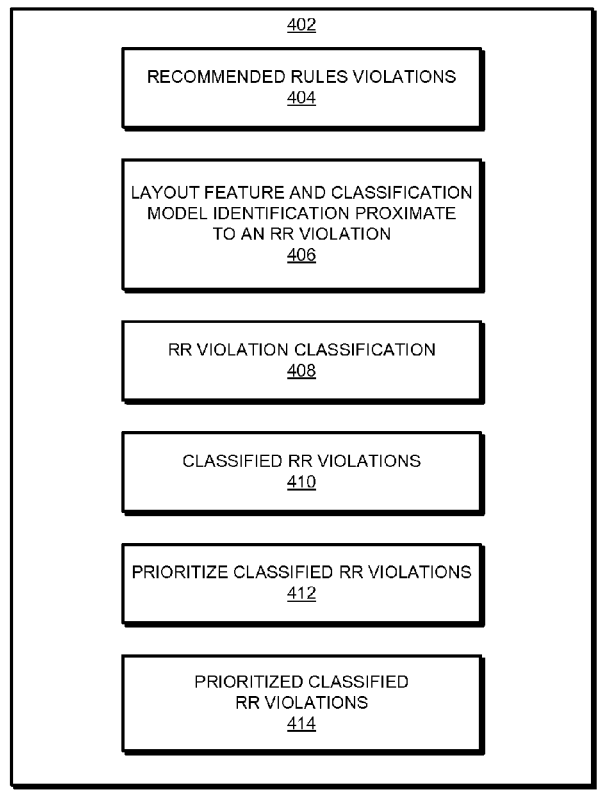
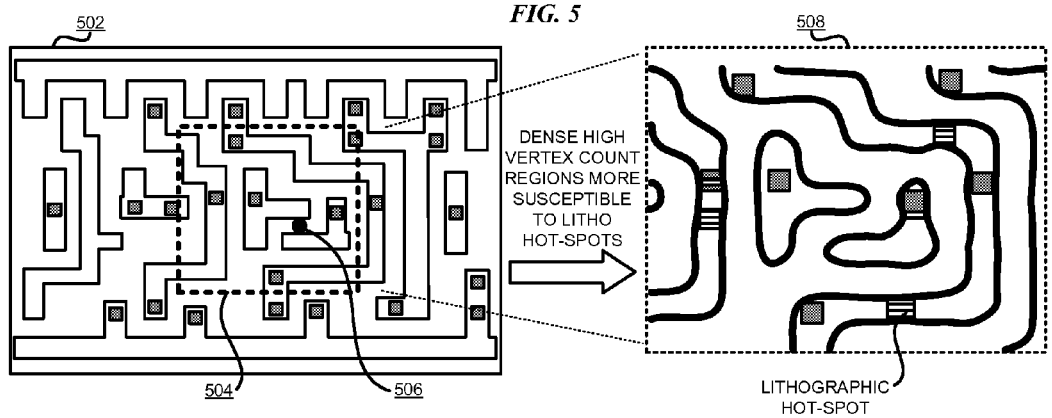

LAYOUT-SPECIFIC CLASSIFICATION AND PRIORITIZATION OF RECOMMENDED RULES VIOLATIONS

TECHNICAL FIELD

The present invention relates generally to a computer implemented method, system, and computer program product for improving an integrated circuit (IC) design. Particularly, the present invention relates to a computer implemented method, system, and computer program product for IC Design layout-specific classification and prioritization of recommended design rules violations.

BACKGROUND

Description of the Related Art

Modern day electronics include components that use integrated circuits. Integrated circuits are electronic circuits formed using Silicon as a substrate and by adding impurities to form solid-state electronic devices, such as transistors, diodes, and resistors. Commonly known as a "chip", an integrated circuit is generally encased in hard plastic, forming a "package".

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A wire is a connection between parts of electronic components, and is formed using a metallic material that conducts electricity. An IC may contain many layers of metal interconnects to implement a circuit. Metal interconnects in different layers are isolated from each other with inter layer dielectric. The metal layers can be connected by creating vias in the dielectric.

In an IC design process, design components such as transistors are placed and interconnected to determine the resulting circuit's characteristics. Components can be moved or changed if certain characteristics have to be altered. The design layout is constructed using different design layers (e.g. polysilicon, metal-1, metal-2, etc.) as specified by the technology. The technology specifications also provide a set of design rules that represent the manufacturing capability of the process. These technology ground rules or design rules should be followed during layout design to create a manufacturable design.

Once a design layout, also referred to simply as a layout, has been finalized for an IC, the design is converted into a set of masks or reticles. During manufacture, a semiconductor wafer is exposed to light or radiation through a mask to form microscopic components of the IC. This process is known as photolithography.

A manufacturing mask is a mask usable for successfully manufacturing or printing the contents of the mask onto wafer. During the printing process, radiation is focused through the mask and at certain desired intensity of the radiation. This intensity of the radiation is commonly referred to as "dose". The focus and the dosing of the radiation have to be precisely controlled to achieve the desired shape and electrical characteristics on the wafer.

SUMMARY

The illustrative embodiments provide a method, system, and computer program product for layout-specific classification and prioritization of recommended design rules violations. In an embodiment a method for classifying and prioritizing a set of recommended rule (RR) violations in an integrated circuit (IC) design receives the set of RR violations. The method receives a layout corresponding to the IC design. The method selects a set of features in the layout. The method selects a classification model corresponding to the set of features. The method classifies, using the set of features and the classification model, the first RR violation into a classification from a set of classifications. The method prioritizes the classification in an order of priority such that the first RR violation in the classification is recommended for remedying in the order of priority.

BRIEF DESCRIPTION OF THE SEVERAL VIEWS OF THE DRAWINGS

The novel features believed characteristic of the embodiments are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 1 depicts a pictorial representation of a network of data processing systems in which illustrative embodiments may be implemented;

FIG. 2 depicts a block diagram of a data processing system in which illustrative embodiments may be implemented;

FIG. 4 depicts a block diagram of an example enhancement to a DRC tool for layout-specific classification and prioritization of RR violations in accordance with an illustrative embodiment;

FIG. 5 depicts an example layout that can be analyzed according to an example feature and classification model in accordance with an illustrative embodiment;

DETAILED DESCRIPTION

Figure 3:
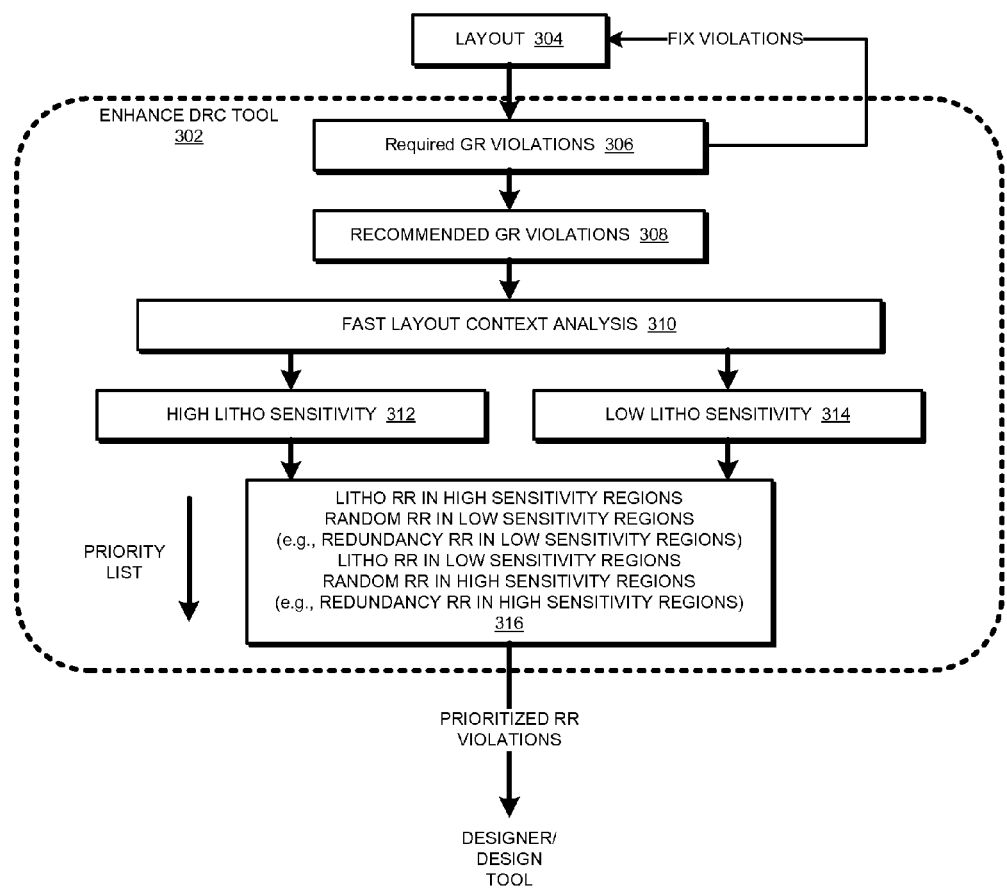
FIG. 3 depicts an example configuration for layout-specific classification and prioritization of RR violations in accordance with an illustrative embodiment.

Required rules are rules that an IC design must obey for the design to be acceptable according to the manufacturing technology specification. In other words, a design's compliance with a required rule is mandatory.

Recommended rules are rules that an IC design should preferably obey, but non-compliance with a recommended rule (RR) does not cause the design to be non-compliant with the manufacturing technology specification, or does not otherwise invalidate the design. Ground rules (GR) are a collection of required rules and recommended rules.

One example reason for specifying an RR is to improve the manufacturability of the design, such by improving the quality of lithographic printing of the design on the wafer. For example, two wires in a design may be required to be 70 nanometer (nm) apart in spacing. However, from a manufacturability point of view, a wider spacing of 80 nm improves the printability of the design. Thus an RR may specify that a minimum spacing between any two components in the design should be at least 80 nm.

At 70 nm, the existing spacing in the design may satisfy all required rules and the design may meet the manufacturing technology specifications. A designer may ignore the RR and let the spacing remain at 70 nm. Thus, the design that goes to manufacturing is a valid design but includes one or more violations of at least one RR that specifies a minimum of 80 nm spacing.

Another example reason for specifying an RR is to improve the reliability of the design. For example, an RR may specify that when a via is used in the design, the via should be duplicated and a redundant via should also connect in the manner of the original via. An object of such an RR is to improve the reliability of the chip when manufactured, such that, in case of a manufacturing defect or other problems with one via, the redundant via can continue to function and not render the chip defective.

Again, the existing design may satisfy all required rules and the design may meet the manufacturing technology specifications with non-duplicated vias. A designer may ignore the redundancy RR and not duplicate a via. Thus, the design that goes to manufacturing is a valid design but includes one or more violations of at least one RR that specifies duplicate vias.

The reasons for ignoring an RR are sometimes based on design considerations. For example, increasing spacing from 70 nm to 80 nm may lower the density of the components in certain regions of the design, causing the overall area of the design to increase. The increased spacing may also move certain components further apart, causing timing and performance problems in the design, which otherwise do not exist in the design with 70 nm spacing.

As another example of a reason to allow a design to go to manufacturing with RR violations, duplicating a via increases the connection points in the design. Thus, while the reliability of the via itself may be improved by the duplicated vias, the increased number of connections may also increase the number of lithography related failure points in the design for manufacturing purposes.

The illustrative embodiments recognize that often potential implications of an RR are unclear from the RR specification. For example, given an RR, a designer cannot readily determine whether the RR imparts more improvements than deteriorations to the design in terms of the density in the design, the performance of the design, or both. As another example, given an RR, a designer cannot quantifiably measure at design time the yield benefits of complying with the RR.

The illustrative embodiments recognize that while some RR violations may be ignored and left unresolved in the design, remedying certain RR violations may actually be beneficial to the design.

Presently, some prioritization methods prioritize RR violations according to statically defined priorities that are not design layout specific. For example, one prioritization method may always prioritize an RR violation that affects manufacturability over an RR violation that affects reliability.

The illustrative embodiments recognize that such static prioritization methods do not take into account the context dependent nature of the effects of certain RR violations from one design to another. The illustrative embodiments further recognize that such static prioritization methods also do not take into account the context dependent nature of the effects of certain RR violations from one instance of the violation in a particular design to another instance of the same violation in another part of the same design.

The illustrative embodiments recognize that affects of RR violations are variable depending on the design layout in which they occur, and on the region of the design in which they occur. In other words, using the example RR of 80 nm spacing that is specified to improve manufacturability, not all violations of such an RR are of the same priority relative to the design layout in which they occur.

For example, a violation of this example RR in a region of a layout with acceptable density may be low priority because remedying the violation may not improve manufacturing yield but may deteriorate the density of the design in that region. On the other hand, remedying the violation in a higher than the threshold density region may improve the manufacturability.

The illustrative embodiments recognize that a list of RR violations classified according to the manufacturing implications of RR violations in a particular design would be advantageous. The illustrative embodiments further recognize that a prioritization of these classified RR violations, also based on layout-specific objectives, will be advantageous in determining which RR violations to remedy in a design.

The illustrative embodiments used to describe the invention generally address and solve the above-described problems and other problems related to determining layout-specific priority of RR violations present in a given IC design. The illustrative embodiments provide a method, system, and computer program product for layout-specific classification and prioritization of RR violations in a given IC design. Using an embodiment, a violation of a particular RR in a design may be classified as having a (higher) severe effect on the manufacturability of the design as compared to another violation of the particular RR in the design where the violation has a (lower) comparatively less severe effect on the manufacturability of the design.

Generally, the illustrative embodiments provide a method of classifying various RR violations according to certain identified features and their corresponding metrics in the design. The illustrative embodiments provide a method to prioritize the classified RR violations based on layout-specific objectives thereafter.

A feature of a design is a shape in the design. Some examples of a feature are spacings, areas, and corners or vertices. A combination of certain features can be present around an RR violation in a given design. For example, a number of vertices or corners, present within a defined distance (proximity) of the location of an RR violation, is usable for classification of the RR violation according to an embodiment.

A manner of using a set of one or more features for classifying an RR is a classification model. For example, one or more pre-determined threshold number of features, such as vertices, can be used as a classification model. Generally, an embodiment applies a classification model to a set of features to determine a classification of a given RR. A measurement of geometric distances between different shapes from the site of the RR violation, an area measurement around the site of the RR violation, or a combination thereof are example ways of using design features in a classification model for classification of RR violations.

In the simplest case, a classification model may use a single feature with a single threshold value of the number of occurrences of that feature in a defined proximity to a given RR. If the number exceeds the threshold, the RR is classified in one classification, and if the number is up to but not exceeding the threshold, the RR is classified in another classification.

As another example according to an embodiment, when the RR violation occurs in a particular design, if the number of vertices present within the threshold distance or area of the RR violation is below a first threshold, the RR violation may be placed in a first classification. If the number of vertices present within the threshold distance or area of the RR violation is between the first threshold and a second threshold, the RR violation may be placed in a second classification. If the number of vertices present within the threshold distance or area of the RR violation exceeds the second threshold, the RR violation may be placed in a third classification.

An embodiment can then prioritize the various classifications of RR violations in a layout-specific manner. For example, for a particular design, an embodiment may utilize a layout-specific rule to prioritize the third classification in the above example as the highest priority RR violations that should be remedied first, followed by the second classification, followed by the first classification. For another design, an embodiment may utilize another rule specific to the other design, to prioritize the second classification in the above example as the highest priority RR violations that should be remedied first, followed by the first classification, followed by the third classification.

The embodiments are described using a simple threshold-based version of the classification model only for the clarity of the description and not as a limitation on the illustrative embodiments. In a typical design, the classification model according to an embodiment is usable with a combination of more than one features, and a classification function of greater complexity than a threshold value. The combination of the features, and the classification function are selectable and adjustable according to the requirements of a particular implementation, and such variations are contemplated within the scope of the illustrative embodiments.

The illustrative embodiments are described with respect to certain design features only as examples. Such descriptions are not intended to be limiting on the illustrative embodiments. For example, an illustrative embodiment described with respect to vertices in an area can be implemented with respect to corner types, e.g., convex, concave, internal or external spacing between an edge causing the violation and another edge in the design, edge run-lengths of shapes causing the RR violation, and many other similar features in the design within the scope of the illustrative embodiments.

Similarly, the illustrative embodiments are described with respect to a certain classification model only as examples. Such descriptions are not intended to be limiting on the illustrative embodiments. For example, a classification model of an illustrative embodiment described with respect to a number of vertices can be implemented using relative sizes, distances, and other measurements within the scope of the illustrative embodiments. As another example, even for a classification model of an illustrative embodiment described with respect to a threshold (and one classification on either side of the threshold) can be implemented with multiple thresholds separating multiple classifications bound by one or more of those thresholds within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention.

The illustrative embodiments are further described with respect to certain applications only as examples. Such descriptions are not intended to be limiting on the invention. An embodiment of the invention may be implemented with respect to any type of application, such as, for example, applications that are served, the instances of any type of server application, a platform application, a stand-alone application, an administration application, or a combination thereof.

An application, including an application implementing all or part of an embodiment, may further include data objects, code objects, encapsulated instructions, application fragments, services, and other types of resources available in a data processing environment. For example, a Java® object, an Enterprise Java Bean (EJB), a servlet, or an applet may be manifestations of an application with respect to which the invention may be implemented. (Java and all Java-based trademarks and logos are trademarks or registered trademarks of Oracle and/or its affiliates).

An illustrative embodiment may be implemented in hardware, software, or a combination thereof. An illustrative embodiment may further be implemented with respect to any type of computing resource, such as a physical or virtual data processing system or components thereof, that may be available in a given computing environment.

The examples in this disclosure are used only for the clarity of the description and are not limiting on the illustrative embodiments. Additional data, operations, actions, tasks, activities, and manipulations will be conceivable from this disclosure and the same are contemplated within the scope of the illustrative embodiments.

The illustrative embodiments are described using specific code, designs, architectures, layouts, schematics, and tools only as examples and are not limiting on the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures.

Any advantages listed herein are only examples and are not intended to be limiting on the illustrative embodiments. Additional or different advantages may be realized by specific illustrative embodiments. Furthermore, a particular illustrative embodiment may have some, all, or none of the advantages listed above.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a pictorial representation of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables. Server 104 and server 106 couple to network 102 along with storage unit 108. Software applications may execute on any computer in data processing environment 100.

In addition, clients 110, 112, and 114 couple to network 102. A data processing system, such as server 104 or 106, or client 110, 112, or 114 may contain data and may have software applications or software tools executing thereon.

A data processing system, such as client 112, may include design rules checking (DRC) tool 105 executing thereon. DRC tool 105 may be an application for checking the compliance of a design with a set a rules, and may be modified according to an embodiment to provide layout-specific classification and prioritization of RR violations in a given IC design. Application 105 may be any suitable application in any combination of hardware and software. Alternatively, application 105 may operate in conjunction with another application (not shown) that implements an embodiment on client 112 or a different data processing system. RR violation classifier 115 performs the layout-specific classification of RR violations according to an embodiment. In one embodiment, RR violation classifier 115 is a part of DRC tool 113. In another embodiment, RR violation classifier 115 is a separate application operating in conjunction with DRC tool 113 on client 112 or a different data processing system.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example.

Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as server 104 or client 110 in FIG. 1, in which computer usable program code or instructions implementing the processes of the illustrative embodiments may be located for the illustrative embodiments.

In the depicted example, data processing system 200 employs a hub architecture including North Bridge and memory controller hub (NB/MCH) 202 and south bridge and input/output (I/O) controller hub (SB/ICH) 204. Processing unit 206, main memory 208, and graphics processor 210 are coupled to north bridge and memory controller hub (NB/MCH) 202. Processing unit 206 may contain one or more processors and may be implemented using one or more heterogeneous processor systems. Graphics processor 210 may be coupled to the NB/MCH through an accelerated graphics port (AGP) in certain implementations.

In the depicted example, local area network (LAN) adapter 212 is coupled to south bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to south bridge and I/O controller hub 204 through bus 238. Hard disk drive (HDD) 226 and CD-ROM 230 are coupled to south bridge and I/O controller hub 204 through bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE) or serial advanced technology attachment (SATA) interface. A super I/O (SIO) device 236 may be coupled to south bridge and I/O controller hub (SB/ICH) 204.

An operating system runs on processing unit 206. The operating system coordinates and provides control of various components within data processing system 200 in FIG. 2. The operating system may be a commercially available operating system such as Microsoft® Windows® (Microsoft and Windows are trademarks of Microsoft Corporation in the United States, other countries, or both), or Linux® (Linux is a trademark of Linus Torvalds in the United States, other countries, or both). An object oriented programming system, such as the Java™ programming system, may run in conjunction with the operating system and provides calls to the operating system from Java™ programs or applications executing on data processing system 200 (Java and all Java-based trademarks and logos are trademarks or registered trademarks of Oracle and/or its affiliates).

Program instructions for the operating system, the object-oriented programming system, the processes of the illustrative embodiments, and applications or programs are located on storage devices, such as hard disk drive 226, and may be loaded into a memory, such as, for example, main memory 208, read only memory 224, or one or more peripheral devices, for execution by processing unit 206. Program instructions may also be stored permanently in non-volatile memory and either loaded from there or executed in place. For example, the synthesized program according to an embodiment can be stored in non-volatile memory and loaded from there into DRAM.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in north bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a PDA.

With reference to FIG. 3, this figure depicts an example configuration for layout-specific classification and prioritization of RR violations in accordance with an illustrative embodiment. Enhanced DRC tool 302 is a DRC tool as improved with an embodiment, such as DRC tool 113 in FIG. 1.

Layout 304 is an example IC design layout created using a GR of required rules and RR. Required GR violations 306 are violations of the required rules in the GR specified for layout 304. Recommended GR violations 308 are violations of the RR in the GR.

Enhanced DRC tool 302 accepts layout 304 and a set of rules, such as a required rules deck. A required rules deck is code corresponding to the required rules against which enhanced DRC tool 302 has to check layout 304's compliance. Enhanced DRC tool 302 generates required GR violations 306 by performing design rules checking function against the required rules deck in a presently known manner.

A design tool or layout designer remedies required GR violations 306 in layout 304. In an iterative process of identifying required GR violations 306 and remedying them in layout 304, a version of layout results that satisfies all the rules in the required rules deck.

Generally, enhanced DRC tool 302 can similarly accept any number of sets of rules, or rule decks, and report compliance/non-compliance therewith. Enhanced DRC tool 302 accepts the required rules compliant version of layout 304 (modified layout 304) and another set of rules, such as an RR deck. An RR deck is code corresponding to the RR against which enhanced DRC tool 302 has to check layout 304's compliance. Enhanced DRC tool 302 generates recommended GR violations 308 (RR violations) by performing design rules checking function against the RR deck.

While the identification of required GR violations 306 and recommended GR violations 308 is described in a serial manner, enhanced DRC tool 302 can accept several rule decks in parallel and perform the violation detection operation against more than one rule decks in parallel within the scope of the illustrative embodiments.

Fast layout context analysis 310 is an analysis of layout 304, original or modified depending on the serial or parallel processing of rule decks. Analysis 310 classifies recommended GR violations 308 according to features specific to layout 304 (the context), and a classification model corresponding to those features.

Only as an example, and without implying a limitation on the illustrative embodiments, FIG. 3 depicts two example classifications 312 and 314 of recommended GR violations 308, namely, those recommended GR violations 308 that have "high lithography sensitivity" (312) and those recommended GR violations 308 that have "low lithography sensitivity" (314).

As in an example described earlier, assume that analysis 310 is performed using the number of vertices in a defined area around one of recommended GR violations 308 as a feature. Further assume that a single threshold metric is defined for that feature. In one embodiment, analysis 310 would classify that recommended GR violation in category 312 if the number of vertices in the area around the recommended GR violation exceeded the threshold. Conversely, analysis 310 would classify that recommended GR violation in category 314 if the number of vertices in the area around the recommended GR violation did not exceed the threshold.

Priority list 316 is a list of classifications, such as classifications 312 and 314, of recommended GR violations 308. Note that analysis 310 can produce any number of classifications, such as classifications 312 and 314, based on the number and type of features, such as geometric features of layout 304, and a classification model corresponding to those features, that are specified for analysis 310.

In the depicted example, list 316 includes classifications 312 and 314 in the first and third order of priority respectively, in the four example classifications that are categorized. Particularly, example list 316 suggests to a designer or a design tool that violations of RRs specified for improving lithographic manufacturability in higher than threshold sensitivity regions of layout 304 should be remedied first, given the specific characteristics of layout 304 (original or modified as the case may be).

Similarly, example list 316 suggests to the designer or the design tool that violations of other RRs (random RRs), e.g., those RRs that are specified for improving reliability, in lower than threshold sensitivity regions of layout 304 should be remedied next, given the specific characteristics of layout 304 (original or modified). Similarly, example list 316 suggests that violations of RRs specified for improving lithographic manufacturability in lower than threshold sensitivity regions of layout 304 should be remedied third, given the specific characteristics of layout 304 (original or modified). Similarly, example list 316 suggests that violations of other RRs, e.g., those RRs that are specified for improving reliability, in higher than threshold sensitivity regions of layout 304 should be remedied last, given the specific characteristics of layout 304.

Of course, the particular ordering of the particular classifications of recommended GR violations in list 316 is only depicted and described as an example to illustrate the operation of an embodiment. Such ordering or classification is not intended to be limiting on the illustrative embodiments. Those of ordinary skill in the art will be able to identify many other priority ordering and classifications from this disclosure, and the same are contemplated within the scope of the illustrative embodiments.

With reference to FIG. 4, this figure depicts a block diagram of an example enhancement to a DRC tool for layout-specific classification and prioritization of RR violations in accordance with an illustrative embodiment. Enhancement 402 may be implemented in an existing DRC tool, or in an application usable in conjunction with an existing DRC tool, such as DRC tool 113 in FIG. 1.

Enhancement 402 receives RR violations 404 for a given layout, such as recommended GR violations 308 for layout 304 in FIG. 3. Enhancement 402 includes component 406, which identifies the layout features and corresponding classification model that are specified for use with the given layout, relative to RR violations 404. In other words, component 406 analyzes an RR violation based on a number of layout features and the corresponding classification model that are specified for use with the given layout. For example, a model according to an embodiment may select certain features and a corresponding classification model from a collection of features and classification models, according to their suitability for a particular layout in question.

As an example, a feature may be a vertex. A number of vertices may be present in an area, such as a square of determined dimensions, about an RR violation. A classification model corresponding to such a feature could use a threshold number of vertices, the threshold being selected in any suitable manner, such as based on a collection of other layouts similar to the layout in question. Component 406 can locate each RR violation 404 on the layout, virtually overlay the square of the determined dimensions about each RR violation 404, and count a number of vertices present in each such square.

Component 408 performs the classification of RR violations 404 according to the analysis performed by component 406. Continuing with the above example, depending on the number of vertices exceeding the threshold in a given area about a particular RR violation 404, component 408 classifies RR violations into a number of classifications of RR violations 410.

Component 412 prioritizes the number of classified RR violations 410 into prioritized list of classified RR violations 414. For example, in one embodiment, component 412 uses a rule or policy specific to the given layout to create prioritized list 414 of classified RR violations 404.

With reference to FIG. 5, this figure depicts an example layout that can be analyzed according to an example feature and a classification model in accordance with an illustrative embodiment. Layout 502 can be used to create RR violations 404 in FIG. 4.

Continuing with the example of number of vertices in an area around an RR violation, assume that a model according to an embodiment specifies square 504 of defined dimensions to be considered (virtually overlaid) with RR violation 506 positioned in the square as shown.

Block 508 depicts a view of the portion of layout 502 within square 504 as manufactured on a wafer. Block 508 shows that a region of the layout having a higher than threshold count of vertices is typically susceptible to lithographic hot-spots. Creating regions such as in block 508, which would be susceptible to lithographic hot-spots, should be avoided.

A component, such as component 406 in FIG. 4, can identify and count the number of vertices in square 504. A component, such as component 408 in FIG. 4, classifies RR violation 506 according to the count's relation to the threshold.

Figure 6:
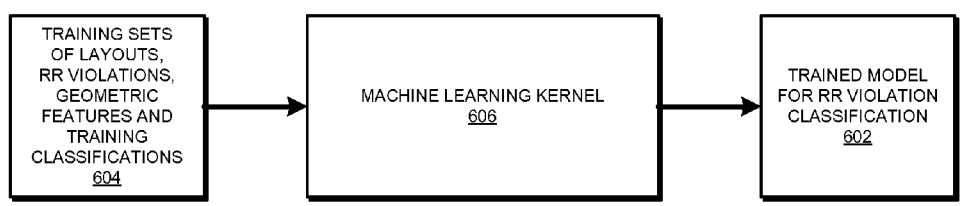
FIG. 6 depicts a block diagram of a process of producing a model for RR violation classification in accordance with an illustrative embodiment.

With reference to FIG. 6, this figure depicts a block diagram of a process of producing a model for RR violation classification in accordance with an illustrative embodiment. Model 602 is a trained model for RR violation classification usable in components 406 and 408 for analyzing RR violations 404 for a given layout, and producing classified RR violations 410 in FIG. 4.

Training sets 604 are one or more sets of training layouts, RR violations, features, together with the desired classifications of the RR violations. Training sets 604 are submitted to machine learning kernel 606.

Machine learning kernel 606 can be any suitable implementation of a machine learning algorithm, including but not limited to an artificial neural network (ANN), or a support vector machine (SVM). Given training set 604, preferably more than one training set 604, machine learning kernel 606 can learn to identify relevant layout features in a layout. Furthermore, machine learning kernel 606 can learn to determine and output a suitable classification model for the identified features in a layout. Machine learning kernel 606 can also output classification results in a layout that is not a part of training sets 604.

Machine learning kernel 604 produces model 602, that is trained to output classification results based on identified input features for new layouts. Model 602 or portions thereof can be implemented in program code to form components 406 and 408 in FIG. 4.

Figure 7:
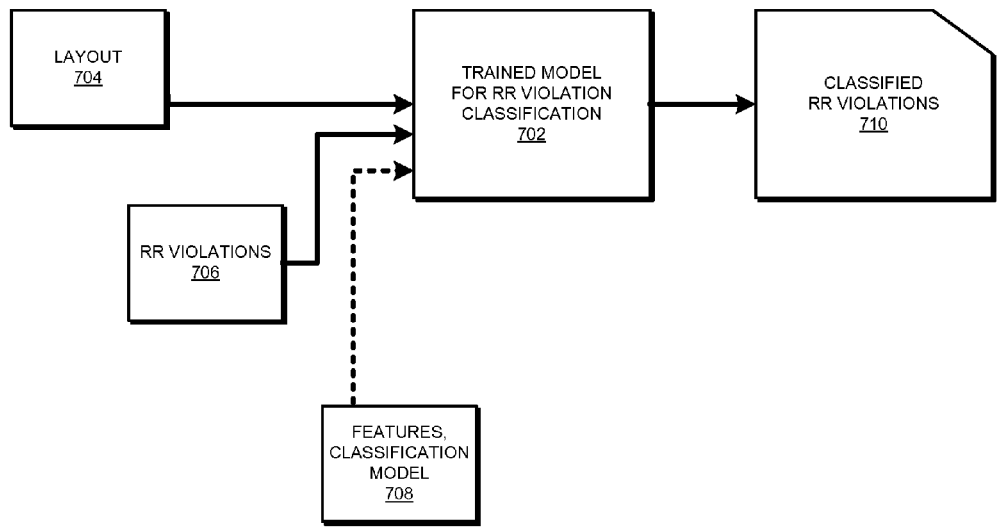
FIG. 7 depicts a block diagram of a model for RR violation classification in operation in accordance with an illustrative embodiment.

With reference to FIG. 7, this figure depicts a block diagram of a model for RR violation classification in operation in accordance with an illustrative embodiment. Model 702 can be implemented using model 602 in FIG. 6. As an example, model 702 as depicted can be implemented as a combination of components 406 and 408 in FIG. 4.

Model 702 receives layout 704, which may be a layout in which RR violations 706 have to be analyzed, classified, and prioritized. In one embodiment, model 702 is configured, such as through training in machine learning kernel 606 in FIG. 6, to identify those features and feature metrics that should be considered in analyzing RR violations 706 in layout 704. In another embodiment, features and classification model 708 to consider in layout 704 for analyzing RR violations 706 are supplied to model 702. Any of inputs 704, 706, and 708 can be supplied by an existing DRC tool, a designer, another application, or a combination thereof.

Based on the training encoded in model 702, by virtue of training sets 604 in FIG. 6, model 702 outputs classified RR violations 710. Classified RR violations 710 includes classification of RR violations 706 in one or more categories based on the features and classification model 708 (either specified to model 702 or identified by model 702).

In one embodiment, layout 704, RR violations 706, classified RR violations 710, and optionally features and classification model 708, can form a training set to be used as additional training set 604 in FIG. 6. Generally, the larger the collection of training sets 604 in FIG. 6, the better is model 602's ability to detect features, determine a classification model, define boundaries, and classify RR violations in new layouts.

Figure 8:
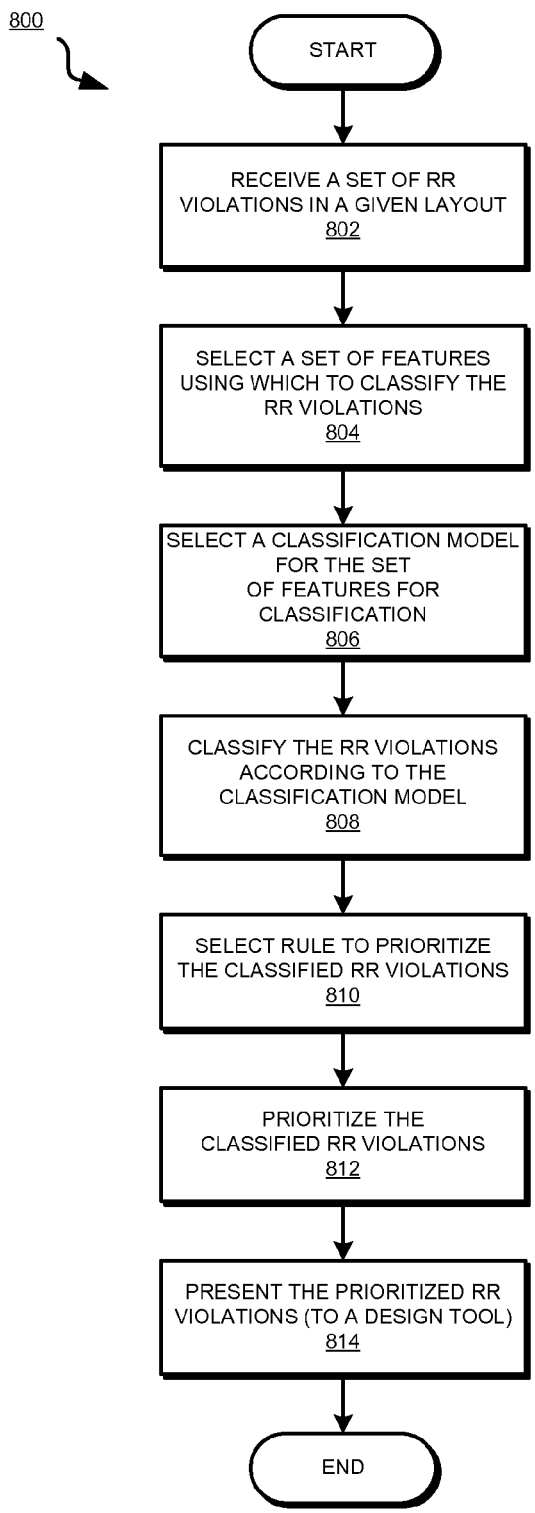
FIG. 8 depicts a block diagram of an example process for layout-specific classification and prioritization of RR violations in accordance with an illustrative embodiment.

With reference to FIG. 8, this figure depicts a block diagram of an example process for layout-specific classification and prioritization of RR violations in accordance with an illustrative embodiment. Process 800 can be implemented in enhancement 402 in FIG. 4. All or part of process 800 can be implemented in model 702 in FIG. 7.

Process 800 begins by receiving a set of RR violations in a given layout (step 802). Process 800 selects a set of features, such as geometric features of the layout, using which to classify the RR violations (step 804).

Process 800 selects a classification model for one or more features in the set of features, for classification of the RR violations (step 806). Process 800 classifies the RR violations according to the features and the corresponding classification model (step 808). A classification model for a feature is only an example simplified model of classification used to describe the operation of an embodiment with clarity. In one embodiment a classification model may correspond to more than one features in a relationship between the features that its more complex than a count of the features relative to a threshold.

Process 800 selects a rule for prioritizing the classified RR violations (step 810). In one embodiment, a rule is provided to process 800, such as from a rules repository over a data network.

Process 800 prioritizes the classified RR violations according to the prioritization rule (step 812). Process 800 presents the prioritized classifications of the RR violations, such as by outputting a prioritized list of RR violations to a design tool (step 814). Process 800 ends thereafter.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, a computer implemented method, system, and computer program product are provided in the illustrative embodiments for layout-specific classification and prioritization of RR violations. Using an embodiment of the invention, RR violations in a given IC design can be categorized and prioritized for remedying in the design. The process of classification and prioritization requires a smaller amount of time as compared to performing full optical lithography simulation. Furthermore, an embodiment can relate a violation to a particular RR, in a defined order of priority based on the characteristics of the given design, with a reasoning that is understandable by a design tool. Such benefits are not obtained from existing design for manufacturability tools or lithography tools.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable storage device(s) or computer readable media having computer readable program code embodied thereon.

Any combination of one or more computer readable storage device(s) or computer readable media may be utilized. The computer readable medium may be a computer readable signal medium or a computer readable storage medium. A computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible device or medium that can contain, or store a program for use by or in connection with an instruction execution system, apparatus, or device.

Program code embodied on a computer readable storage device or computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to one or more processors of one or more general purpose computers, special purpose computers, or other programmable data processing apparatuses to produce a machine, such that the instructions, which execute via the one or more processors of the computers or other programmable data processing apparatuses, create means for implementing the functions/acts specified in the flowchart and/or block diagram block or blocks.

These computer program instructions may also be stored in one or more computer readable storage devices or computer readable that can direct one or more computers, one or more other programmable data processing apparatuses, or one or more other devices to function in a particular manner, such that the instructions stored in the one or more computer readable storage devices or computer readable medium produce an article of manufacture including instructions which implement the function/act specified in the flowchart and/or block diagram block or blocks.

The computer program instructions may also be loaded onto one or more computers, one or more other programmable data processing apparatuses, or one or more other devices to cause a series of operational steps to be performed on the one or more computers, one or more other programmable data processing apparatuses, or one or more other devices to produce a computer implemented process such that the instructions which execute on the one or more computers, one or more other programmable data processing apparatuses, or one or more other devices provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, a set includes one or more member unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method for classifying and prioritizing a set of recommended rule (RR) violations in an integrated circuit (IC) design, the method comprising:
    receiving the set of RR violations;
    receiving a layout corresponding to the IC design;
    selecting a set of features in the layout;
    selecting a classification model corresponding to the set of features;
    classifying, using a processor and a memory, and using the set of features and the classification model, the first RR violation into a classification from a set of classifications; and
    prioritizing the classification in an order of priority such that the first RR violation in the classification is recommended for remedying in the order of priority.

2. The method of claim 1, further comprising:
    training, using a machine learning algorithm, a model for RR violation classification, wherein the training comprises:
    supplying the machine learning algorithm with at least one training set of a training layout, training RR violations, training features, and training classifications;
    outputting from the machine learning algorithm, the model; and
    encoding the model to execute in the data processing system and perform the classifying.

3. The method of claim 2, wherein the model, when supplied with the layout and the set of RR violations, identifies the geometric feature and the classification.

4. The method of claim 3, wherein the model further determines an area surrounding the first RR violation within which to analyze an effect of remedying the first RR violation on the layout.

5. The method of claim 3, further comprising:
    supplying the layout, the set of RR violations, the set of classifications, and the geometric feature as a second training set to the machine learning algorithm, the supplying improving the model to an improved model;
    encoding the improved model to execute in the data processing system; and
    classifying a second layout, having a second set of RR violations, using the improved model.

6. The method of claim 1, wherein the prioritizing further comprises:
    receiving a prioritization rule, the prioritization rule being related to the layout, wherein the prioritizing occurs in compliance with the prioritization rule.

7. The method of claim 1, wherein the set of features and the classification model are received from a data source.

8. The method of claim 1, wherein the set of features is a set of vertices in a defined area surrounding an RR in the set of RRs, and wherein the classification model uses a threshold value for a number of members of the set of features to classify the RR.

9. A computer usable program product comprising a computer usable storage device including computer usable code for classifying and prioritizing a set of recommended rule (RR) violations in an integrated circuit (IC) design, the computer usable code comprising:
    computer usable code for receiving the set of RR violations;
    computer usable code for receiving a layout corresponding to the IC design;
    computer usable code for selecting a set of features in the layout;
    computer usable code for selecting a classification model corresponding to the set of features;
    computer usable code for classifying, using the set of features and the classification model, the first RR violation into a classification from a set of classifications; and
    computer usable code for prioritizing the classification in an order of priority such that the first RR violation in the classification is recommended for remedying in the order of priority.

10. The computer usable program product of claim 9, further comprising:
    computer usable code for training, using a machine learning algorithm, a model for RR violation classification, wherein the computer usable code for training comprises:
    computer usable code for supplying the machine learning algorithm with at least one training set of a training layout, training RR violations, training features, and training classifications;
    computer usable code for outputting from the machine learning algorithm, the model; and
    computer usable code for encoding the model to execute in the data processing system and perform the classifying.

11. The computer usable program product of claim 10, wherein the model, when supplied with the layout and the set of RR violations, identifies the geometric feature and the classification.

12. The computer usable program product of claim 11, wherein the model further determines an area surrounding the first RR violation within which to analyze an effect of remedying the first RR violation on the layout.

13. The computer usable program product of claim 11, further comprising:
   computer usable code for supplying the layout, the set of RR violations, the set of classifications, and the geometric feature as a second training set to the machine learning algorithm, the supplying improving the model to an improved model;
   computer usable code for encoding the improved model to execute in the data processing system; and
   computer usable code for classifying a second layout, having a second set of RR violations, using the improved model.

14. The computer usable program product of claim 9, wherein the computer usable code for prioritizing further comprises:
   computer usable code for receiving a prioritization rule, the prioritization rule being related to the layout, wherein the prioritizing occurs in compliance with the prioritization rule.

15. The computer usable program product of claim 9, wherein the set of features and the classification model are received from a data source.

16. The computer usable program product of claim 9, wherein the computer usable code is stored in a computer readable storage medium in a data processing system, and wherein the computer usable code is transferred over a network from a remote data processing system.

17. The computer usable program product of claim 9, wherein the computer usable code is stored in a computer readable storage medium in a server data processing system, and wherein the computer usable code is downloaded over a network to a remote data processing system for use in a computer readable storage medium associated with the remote data processing system.

18. A data processing system for classifying and prioritizing a set of recommended rule (RR) violations in an integrated circuit (IC) design, the data processing system comprising:
   a storage device including a storage medium, wherein the storage device stores computer usable program code; and
   a processor, wherein the processor executes the computer usable program code, and wherein the computer usable program code comprises:
      computer usable code for receiving the set of RR violations;
      computer usable code for receiving a layout corresponding to the IC design;
      computer usable code for selecting a set of features in the layout;
      computer usable code for selecting a classification model corresponding to the set of features;
      computer usable code for classifying, using the set of features and the classification model, the first RR violation into a classification from a set of classifications; and
      computer usable code for prioritizing the classification in an order of priority such that the first RR violation in the classification is recommended for remedying in the order of priority.

19. The data processing system of claim 18, further comprising:
   computer usable code for training, using a machine learning algorithm, a model for RR violation classification, wherein the computer usable code for training comprises: computer usable code for supplying the machine learning algorithm with at least one training set of a training layout, training RR violations, training features, and training classifications; computer usable code for outputting from the machine learning algorithm, the model; and computer usable code for encoding the model to execute in the data processing system and perform the classifying.

20. The data processing system of claim 19, wherein the model, when supplied with the layout and the set of RR violations, identifies the geometric feature and the classification.

* * * * *